United States Patent
Saimei et al.

(10) Patent No.: US 11,049,835 B2
(45) Date of Patent: Jun. 29, 2021

(54) SEMICONDUCTOR MODULE

(71) Applicant: Murata Manufacturing Co., Ltd., Kyoto (JP)

(72) Inventors: Tsunekazu Saimei, Nagaokakyo (JP); Takeshi Suzuki, Nagaokakyo (JP); Masashi Yamaura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/508,739

(22) Filed: Jul. 11, 2019

(65) Prior Publication Data

US 2019/0333890 A1    Oct. 31, 2019

Related U.S. Application Data

(62) Division of application No. 15/837,560, filed on Dec. 11, 2017, now Pat. No. 10,403,593.

(Continued)

(51) Int. Cl.
*H01L 23/00*    (2006.01)
*H01L 23/498*    (2006.01)
(Continued)

(52) U.S. Cl.
CPC .............. *H01L 24/32* (2013.01); *H01L 21/52* (2013.01); *H01L 21/56* (2013.01); *H01L 23/00* (2013.01);
(Continued)

(58) Field of Classification Search
CPC ......... H01L 24/32; H01L 24/73; H01L 24/26; H01L 24/48; H01L 24/29; H01L 24/83; H01L 23/498; H01L 23/13; H01L 23/29; H01L 23/12; H01L 23/31; H01L 23/23; H01L 23/488; H01L 23/00; H01L 23/49811; H01L 23/49827; H01L 23/293; H01L 23/49894; H01L 23/49838; H01L 23/3121; H01L 21/52; H01L 21/56; H01L 2924/35121; H01L 2224/48137; H01L 2224/26175; H01L 2224/32227; H01L 2224/48091; H01L 2224/48227; H01L 2224/73265

(Continued)

(56) References Cited

U.S. PATENT DOCUMENTS 6,338,984 B2 *  1/2002  Minamio .............. H01L 21/565
                                                           257/666
6,548,328 B1    4/2003  Sakamoto et al.
(Continued)

*Primary Examiner* — Dao H Nguyen
(74) *Attorney, Agent, or Firm* — Studebaker & Brackett PC

(57) ABSTRACT

A semiconductor module that restrains the occurrence of detachment and an operation failure. The semiconductor module includes a PCB base, a conductive die pad provided on the PCB base, a semiconductor die provided on the conductive die pad, and a conductive die bonding agent that electrically connects the conductive die pad and the semiconductor die. The semiconductor module further includes a wire bonding pad provided on the PCB base, a wire that electrically connects the wire bonding pad and the semiconductor die, and a sealing resin that seals the conductive die pad, the semiconductor die, the conductive die bonding agent, the wire bonding pad, and the wire. In a planar view, the area of the conductive die pad is 5.0 mm² or less.

3 Claims, 14 Drawing Sheets

Related U.S. Application Data

(60) Provisional application No. 62/434,119, filed on Dec. 14, 2016.

(51) Int. Cl.
*H01L 23/29* (2006.01)
*H01L 21/52* (2006.01)
*H01L 21/56* (2006.01)
*H01L 23/13* (2006.01)
*H01L 23/12* (2006.01)
*H01L 23/31* (2006.01)
*H01L 23/488* (2006.01)

(52) U.S. Cl.
CPC .............. *H01L 23/12* (2013.01); *H01L 23/13* (2013.01); *H01L 23/29* (2013.01); *H01L 23/293* (2013.01); *H01L 23/31* (2013.01); *H01L 23/488* (2013.01); *H01L 23/498* (2013.01); *H01L 23/49811* (2013.01); *H01L 23/49827* (2013.01); *H01L 24/26* (2013.01); *H01L 24/48* (2013.01); *H01L 24/73* (2013.01); *H01L 23/3121* (2013.01); *H01L 23/49838* (2013.01); *H01L 23/49894* (2013.01); *H01L 24/45* (2013.01); *H01L 2224/26175* (2013.01); *H01L 2224/32227* (2013.01); *H01L 2224/45144* (2013.01); *H01L 2224/48091* (2013.01); *H01L 2224/48137* (2013.01); *H01L 2224/48227* (2013.01); *H01L 2224/49175* (2013.01); *H01L 2224/73265* (2013.01); *H01L 2924/35121* (2013.01)

(58) Field of Classification Search
USPC ....... 257/741, 728, 772, 777, 784, 197, 341, 257/E23.024, E23.052, E23.061, E25.011, 257/E25.053, E27.015, E27.053, E27.06, 257/E21.503, E21.506, E21.511, E21.696; 438/666, 667, 668, 669, 312
See application file for complete search history.

(56) References Cited

U.S. PATENT DOCUMENTS

| | | | |
|---|---|---|---|
| 6,566,168 B2 * | 5/2003 | Gang | .................... H01L 21/566 257/676 |
| 6,635,957 B2 | 10/2003 | Kwan et al. | |
| 7,863,108 B2 | 1/2011 | Dimaano, Jr. et al. | |
| 8,218,328 B2 | 7/2012 | Maejima et al. | |
| 9,825,005 B2 * | 11/2017 | Yeh | ........................ H01L 24/81 |
| 2002/0153596 A1 | 10/2002 | Tsubosaki et al. | |
| 2004/0056337 A1 * | 3/2004 | Hasebe | ............... H01L 23/3107 257/667 |
| 2006/0270114 A1 * | 11/2006 | Nishi | .................. H01L 31/0203 438/118 |
| 2008/0157327 A1 * | 7/2008 | Yang | ..................... H01L 25/105 257/686 |
| 2009/0078455 A1 | 3/2009 | Takakusaki et al. | |
| 2009/0130996 A1 * | 5/2009 | Kudaishi | ................ H01L 24/49 455/90.3 |
| 2010/0109052 A1 * | 5/2010 | Nakajima | ....... H01L 21/823425 257/197 |
| 2011/0133327 A1 * | 6/2011 | Hsu | ....................... H01L 21/563 257/692 |
| 2011/0286188 A1 | 11/2011 | Kanai et al. | |
| 2014/0001619 A1 | 1/2014 | Yoo et al. | |

* cited by examiner

SEMICONDUCTOR MODULE

CROSS-REFERENCE TO RELATED APPLICATION

This application is a divisional of U.S. application Ser. No. 15/837,560 filed Dec. 11, 2017, which claims benefit of priority to U.S. Provisional Patent Application No. 62/434,119, filed Dec. 14, 2016, the entire content of which is incorporated herein by reference.

BACKGROUND

Technical Field

The present disclosure relates to a semiconductor module.

Description of Related Art

There has been known a semiconductor module in which a semiconductor die provided on a conductive die pad is sealed by a resin. In general, resins exhibit a poor thermal conductivity, so that the size of a conductive die pad is increased thereby to dissipate the heat generated in a semiconductor die.

SUMMARY

However, a stress test in which reflow is carried out in a hot and humid environment has confirmed the occurrence of detachment between a conductive die bonding agent, which is used to connect a semiconductor die to a conductive die pad, and the conductive die pad. In addition, operation failures, such as a malfunction and fluctuations in gain value, have been also confirmed.

The present disclosure has been made in view of the circumstances described above, and it is an object of the disclosure to provide a semiconductor module that reduces the detachment between a conductive die bonding agent and a conductive die pad or a semiconductor die, and operation failures.

A semiconductor module according to an aspect of the present disclosure includes: a substrate; a conductive die pad provided on the substrate; a semiconductor die provided on the conductive die pad; a conductive die bonding agent that electrically connects the conductive die pad and the semiconductor die; a wire bonding pad provided on the substrate; and a wire that electrically connects the wire bonding pad and the semiconductor die. The semiconductor module further includes a sealing resin that seals at least the conductive die pad, the semiconductor die, the conductive die bonding agent, the wire bonding pad, and the wire. Further, the area of the conductive die pad is 5.0 mm$^2$ or less in a planar view.

A semiconductor module according to another aspect of the present disclosure includes: a substrate; a conductive die pad which is provided on the substrate and the surface material of which is Cu; a semiconductor die provided on the conductive die pad; and a conductive die bonding agent which electrically connects the conductive die pad and the semiconductor die. The semiconductor module according to this aspect further includes a wire bonding pad which is provided on the substrate and the surface material of which is a metal containing Au; and a wire which electrically connects the wire bonding pad and the semiconductor die.

A semiconductor module according to yet another aspect of the present disclosure includes: a substrate; a first conductive die pad provided on the substrate; a second conductive die pad provided adjacently to and apart from the first conductive die pad on the substrate; and a semiconductor die. The semiconductor module according to this aspect further includes a conductive die bonding agent which is in contact with the first conductive die pad, the second conductive die pad, and a substrate in a gap between the first conductive die pad and the second conductive die pad, and which electrically connects the first conductive die pad and the second conductive die pad and the semiconductor die.

According to the present disclosure, a semiconductor module can be provided, which restricts the detachment between a conductive die bonding agent and a conductive die pad or a semiconductor die.

DETAILED DESCRIPTION

The following will describe in detail the embodiments of the present disclosure with reference to the accompanying drawings. A description of the elements that have the same functions or configurations as those of comparative examples or other embodiments will be simplified or omitted. The following embodiments are illustrations for explaining the present disclosure and are not meant to limit the present disclosure only to the embodiments. Further, the present disclosure can be implemented in a variety of modifications insofar as the modifications do not depart from the spirit of the present disclosure.

Figure 1A:
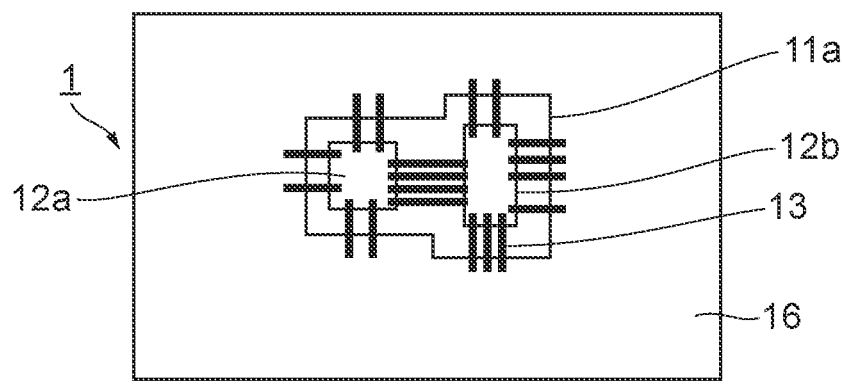
FIGS. 1A through 1D present schematic plan views illustrating a semiconductor module of a comparative example and a semiconductor module of an embodiment.

FIGS. 1A-1D present schematic plan views illustrating a semiconductor module 1 according to a comparative example and semiconductor modules 2, 3 and 4 according to the embodiments. FIG. 1A illustrates the semiconductor module 1 according to the comparative example, which includes a PCB base 16 (substrate), a conductive die pad 11a placed on the PCB base 16, two semiconductor dies 12a and 12b placed on the conductive die pad 11a, and a conductive die bonding agent (conductive die bond), which is not illustrated, the bonding agent being used to electrically connect the semiconductor dies 12a and 12b to the conductive die pad 11a. The semiconductor module 1 further includes a plurality of wires 13 for electrically interconnecting the semiconductor dies 12a and 12b, or electrically connecting the semiconductor dies 12a and 12b with other metal wiring (not illustrated). Further, these elements are sealed by a sealing resin (not illustrated).

Figure 1B:
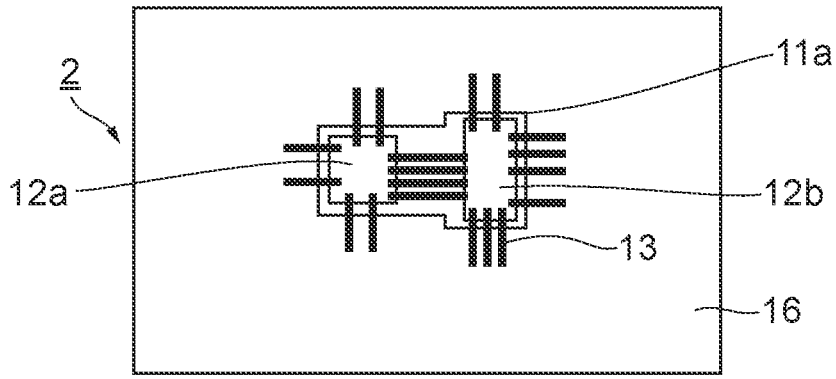

FIG. 1B illustrates a semiconductor module 2 according to a first embodiment. A conductive die pad 11b of the semiconductor module 2 is formed to have an area that is smaller than the area of the conductive die pad 11a of the comparative example, as observed in a planar view. Hence, the distance between the boundaries of the semiconductor dies 12a and 12b and the boundary of the conductive die pad 11b is smaller than that in the comparative example. Further, the area of a conductive die bonding agent (not illustrated) applied onto the conductive die pad 11b is also smaller. The semiconductor module 2 will be further described hereinafter.

Figure 1C:
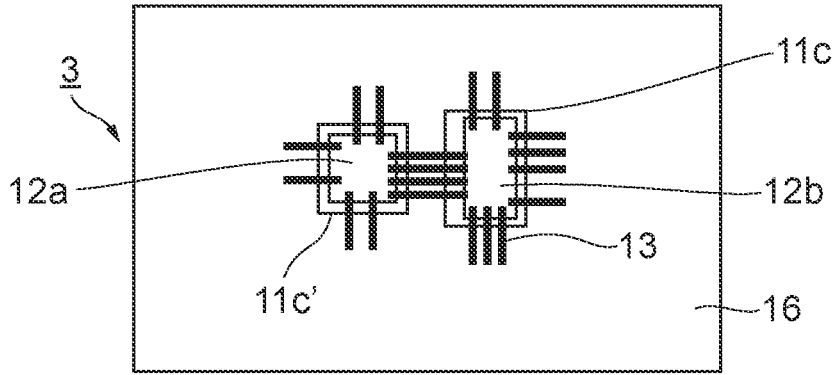

FIG. 1C illustrates a semiconductor module 3 according to a second embodiment. A conductive die pad 11c of the semiconductor module 3 and a conductive die pad 11c' adjacent to the conductive die pad 11c are formed apart from each other. Further, the semiconductor dies 12b and 12a are formed on the conductive die pads 11c and 11c', respectively. The adjoining semiconductor dies 12a and 12b are electrically connected by at least one wire 13. The semiconductor module 3 will be further described hereinafter.

Figure 1D:
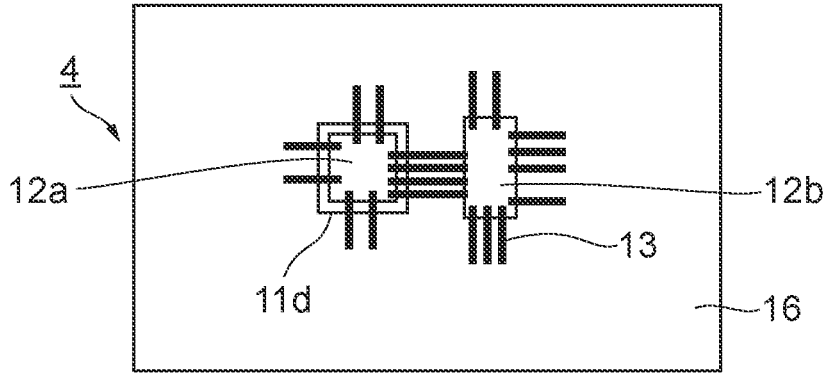

FIG. 1D illustrates a semiconductor module 4 according to a third embodiment. A semiconductor die 12b of adjoining semiconductor dies 12a and 12b of the semiconductor module 4 does not require electrical connection from a bottom surface. Hence, a conductive die pad for the semiconductor die 12b is not provided, while a conductive die pad 11d electrically connected with the semiconductor die 12a through a conductive die bonding agent (not illustrated) is provided. The semiconductor die 12b is connected directly to a PCB base 16 through an insulating die bonding agent or through a solder resist (not illustrated). The semiconductor module 4 will be further described hereinafter.

Figure 2A:
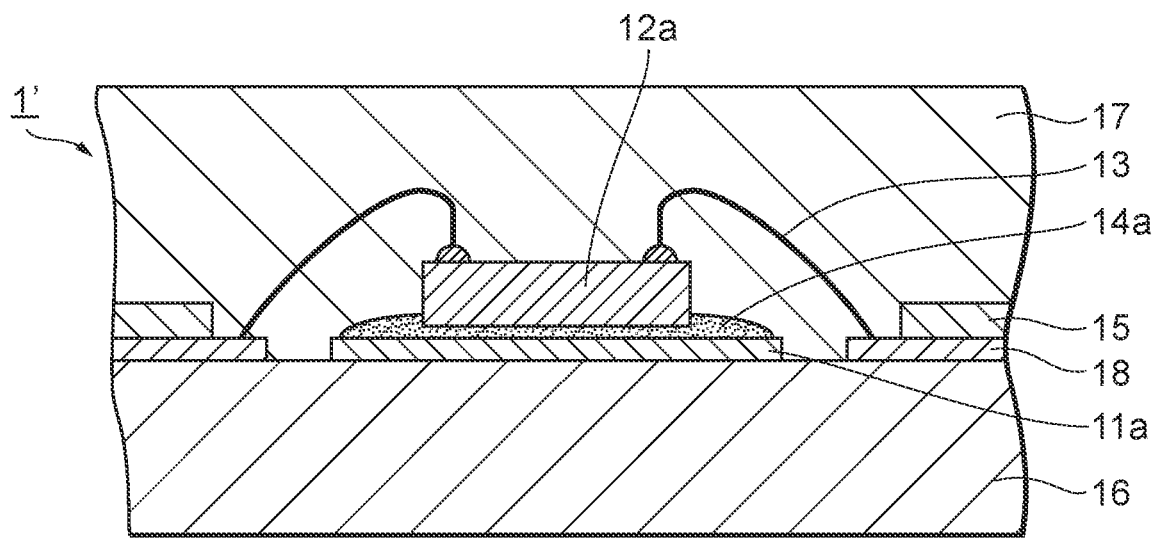
FIGS. 2A and 2B present the sectional views of a semiconductor module according to the comparative example.

FIG. 2A is a sectional view of a semiconductor module 1' according to another comparative example. As illustrated in the sectional view, the semiconductor module 1' includes a PCB base 16 (substrate), a conductive die pad 11a placed on the PCB base 16, a semiconductor die 12a placed on the conductive die pad 11a, and a conductive die bonding agent 14a which electrically connects the conductive die pad 11a and the semiconductor die 12a. Further, a wire bonding pad 18 and a metal wire connected to the wire bonding pad 18 are formed on the PCB base 16 such that the wire bonding pad 18 is adjacent to and apart from the conductive die pad 11a. The wire bonding pad 18 and the semiconductor die 12a are electrically connected by a wire 13. Metal wiring for the connection is protected by a solder resist 15. Further, these elements are sealed by a sealing resin 17.

Figure 2B:
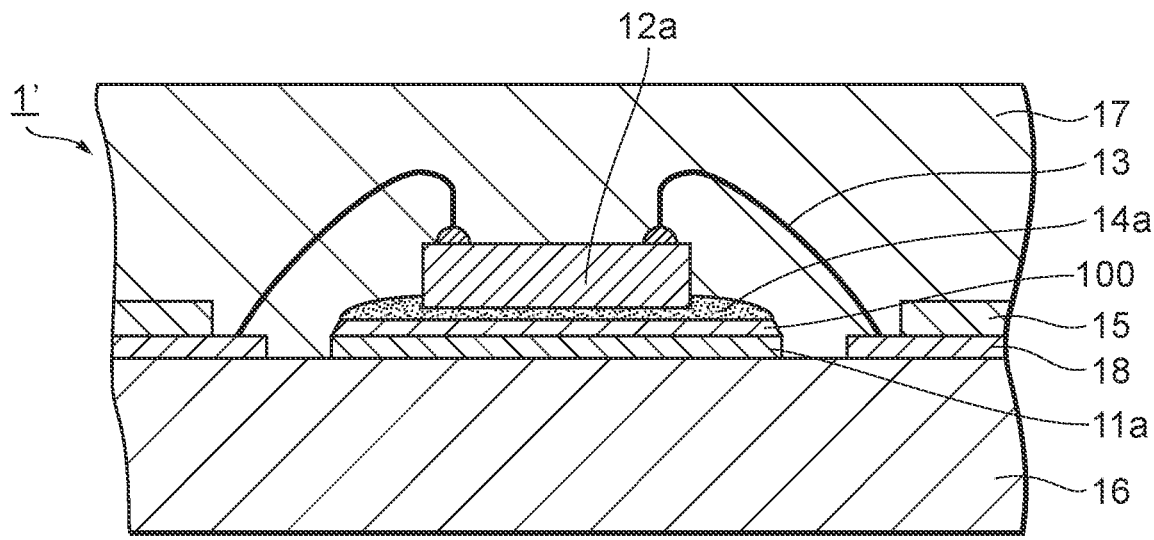

The semiconductor module 1' was subjected to a stress test, in which a plurality of reflows at 250° C. or more are carried out in a hot and humid environment (e.g. a temperature of 80° C. or more and a humidity of 80% or more) (hereinafter referred to as "the hot and humid stress test"). The test results have revealed detachment 100 between the conductive die bonding agent 14a and the conductive die pad 11a, as illustrated in FIG. 2B. It has also been confirmed that the detachment occurs between the conductive die bonding agent 14a and the semiconductor die 12a in some cases, and the detachment occurs also between the sealing resin 17 and the conductive die pad 11a in some cases. Further, defects in characteristics, such as operation failures and fluctuations in gain value, were also confirmed.

The inventors have carried out the hot and humid stress test, using semiconductor dies and conductive die pads of various different shapes and sizes to identify the cause, and have found that the conductive die bonding agent is responsible for the detachment and the operation failures. The inventors have further discovered that the foregoing problems can be effectively restrained by decreasing the areas of the conductive die pads, regardless of the sizes or the shapes of the semiconductor dies.

Figure 3:
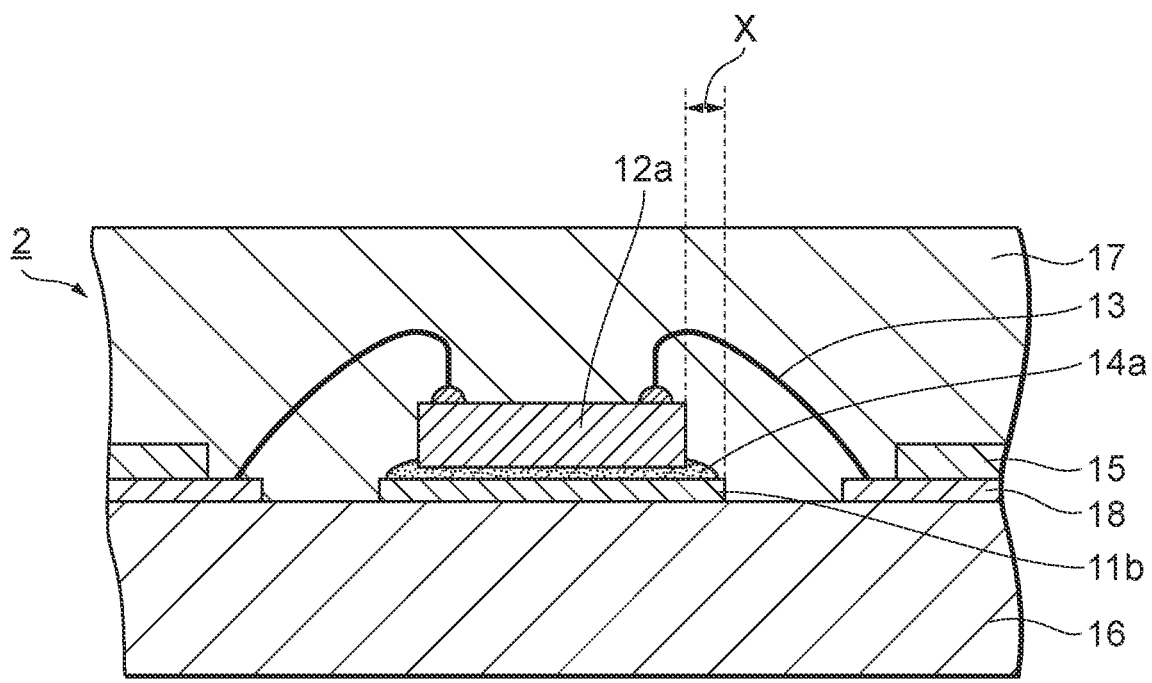
FIG. 3 is a sectional view of a semiconductor module according to a first embodiment.
Figure 4A:
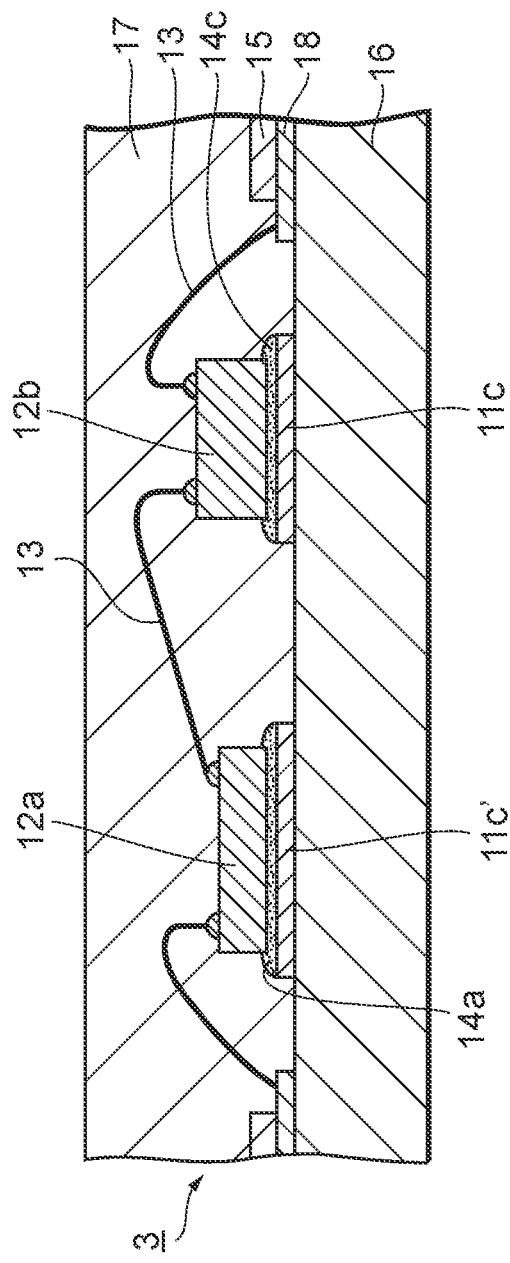
FIGS. 4A and 4B present sectional views of a semiconductor module according to a second embodiment.
Figure 4B:
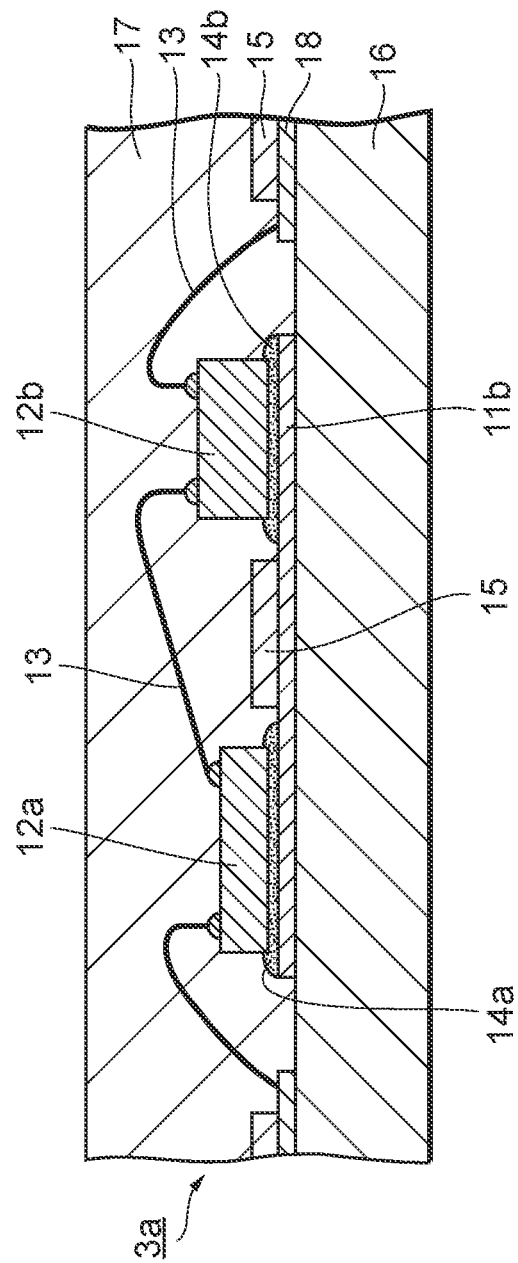
Figure 5:
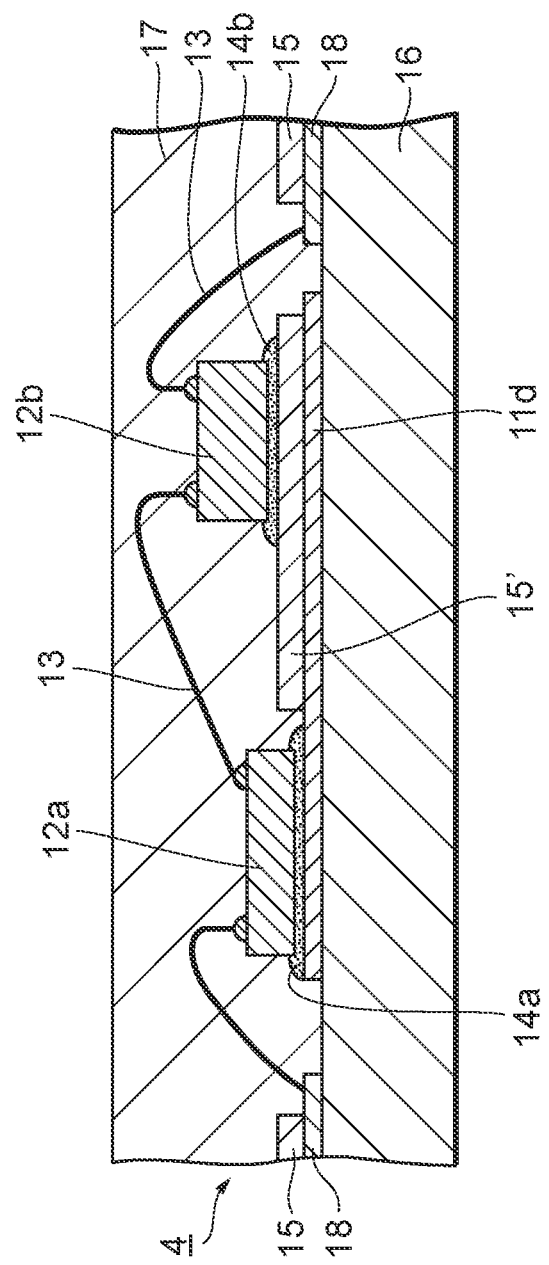
FIG. 5 is a sectional view of a semiconductor module according to a third embodiment.

FIG. 3 to FIG. 5 are the sectional views of the semiconductor modules 2, 3 and 4 according to the first to the third embodiments, illustrating the modes that enable the area of each conductive die pad to be decreased. Each mode can be used in combination with other modes or used alone. The following will first describe the configurations of the semiconductor modules 2, 3 and 4, and then describe the advantages of the configurations.

FIG. 3 is a sectional view of the semiconductor module 2 according to the first embodiment. As described above, the conductive die pad 11b differs from the conductive die pad 11a of the comparative example in that the conductive die pad 11b is designed to have a smaller area than that of the conductive die pad 11a in a planar view. More specifically, the area of the conductive die pad 11a of the comparative example is approximately 6.1 mm$^2$, and the area of the conductive die pad 11b of the present embodiment is approximately 5.0 mm$^2$. Further, the amount and the viscosity of the conductive die bonding agent 14a are adjusted in advance so as not to run off of the conductive die pad 11b. Therefore, the area of the conductive die bonding agent 14a in the planar view is also approximately 5.0 mm$^2$.

The area of the conductive die pad 11b (and the conductive die bonding agent 14a) has been reduced, so that a distance X between the boundary of the conductive die pad 11b (and the conductive die bonding agent 14a) and the boundary of the semiconductor die 12a in the planar view decreases accordingly.

The distance X between the boundary of the conductive die pad 11b and the semiconductor die 12a in the planar view refers to a smallest distance among the distances of the perpendiculars between the sides constituting the boundary of the conductive die pad 11b (and the conductive die bonding agent 14a) and the corresponding sides of the semiconductor die 12a. Hence, if the distance between an upper side of the conductive die pad 11b and an upper side of the semiconductor die 12a in the planar view is 0.1 mm, and the distance between the remaining sides of the conductive die pad 11b and the corresponding remaining sides of the semiconductor die 12a is 0.3 mm, then the distance X will be 0.1 mm. The distance X of the semiconductor module 10 in the comparative example is 0.125 mm, while the distance X of the semiconductor module 2 is 0.07 mm.

The advantageous effect of the embodiment obtained by the reduced area of the conductive die pad 11b (and the conductive die bonding agent 14a) will be discussed later.

FIG. 4A is a sectional view of a semiconductor module 3 according to a second embodiment. For the second embodiment and after, the aspects common to the first embodiment or the comparative example will not be described, and only different aspects will be described. In particular, the same operation and effect obtained by the same configuration will not be described for each embodiment.

The semiconductor module 3 differs from the semiconductor module 2 according to the first embodiment in that a conductive die pad 11c and a conductive die pad 11c' (a second conductive die pad) adjacent to the conductive die pad 11c are formed apart from each other. Further, semiconductor dies 12a and 12b (a second semiconductor die) are provided on the conductive die pads 11c' and 11c, respectively. The adjoining semiconductor dies 12a and 12b are electrically connected by at least one wire 13 (a second wire).

Providing the plurality of conductive die pads 11c and 11c' formed apart on a plurality of adjacent semiconductor dies 12a and 12b, respectively, by the wire 13 as described above makes it possible to decrease the areas of the conductive die pads. The amount and viscosity of conductive die bonding agents 14a and 14c (a second conductive die bonding agent) are adjusted to prevent the conductive die bonding agents 14a and 14c from running off of the conductive die pads 11c and 11c' due to their surface tensions. This makes it possible to also decrease the areas of the conductive die bonding agents as the areas of the conductive die pads are decreased.

FIG. 4B is a sectional view of a semiconductor module 3a, which is a modification example of the semiconductor module 3 according to the second embodiment. The semiconductor module 3a differs from the semiconductor module 2 in that a solder resist 15 is provided on a region between adjoining semiconductor dies 12a and 12b (a third semiconductor die) on the conductive die pad 11b. Therefore, conductive die bonding agents 14a and 14b (a third conductive die bonding agent) are blocked by the solder resist 15, thus making it possible to decrease the surface areas of the conductive die bonding agents 14a and 14b to 4.9 mm². Further, the solder resist 15 is provided adjacently to the semiconductor dies 12a and 12b, so that the distance between the boundary of the conductive die bonding agents 14a and 14b and the semiconductor die 12a in the planar view can be further decreased to, for example, X=0.04 mm to 0.06 mm.

FIG. 5 is a sectional view of a semiconductor module 4 according to a third embodiment. The semiconductor module 4 differs from the semiconductor module 2 according to the first embodiment in that a solder resist 15' (a second solder resist) is provided on a part of a conductive die pad 11d, and the solder resist 15' and a semiconductor die 12b are connected by an insulating die bonding agent 14b (insulating die bonding agent). Providing the semiconductor die 12b, which is not required to be electrically connected to a bottom surface, on the solder resist 15' makes it possible to restrain a conductive die bonding agent 14a from spreading with a resultant increased surface area thereof. Further, the insulating die bonding agent 14b is used, so that the area occupied by the conductive die bonding agent can be reduced.

Figure 6B:
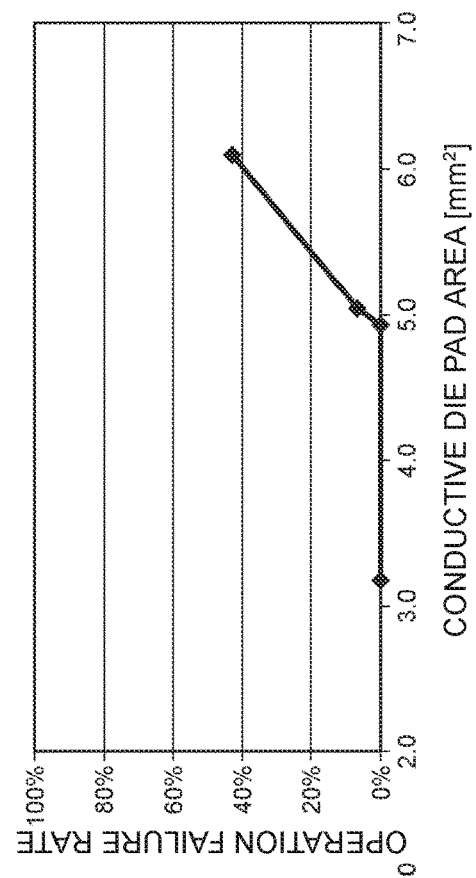
FIGS. 6A and 6B present graphs illustrating the areas of conductive die pads (and conductive die bonding agents) and the results of hot and humid stress tests.
Figure 6A:
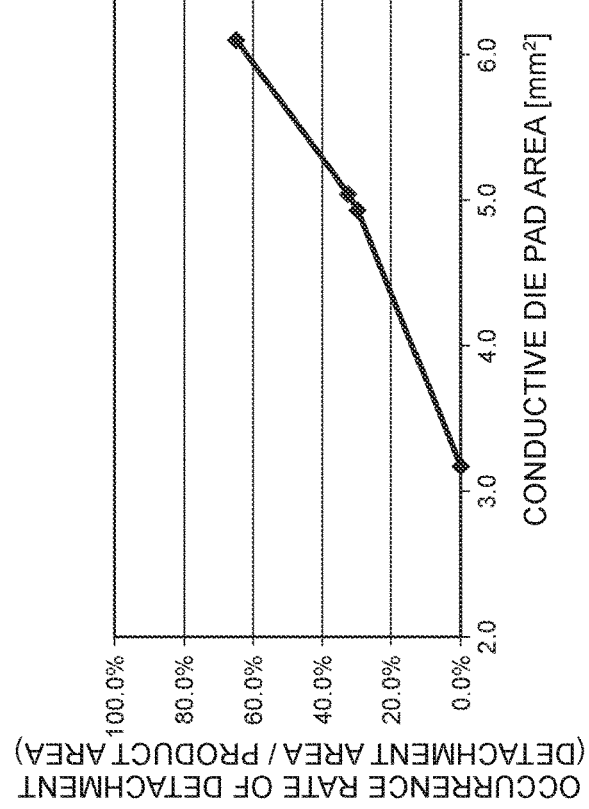

FIG. 6A illustrates the relationship between the area of a conductive die pad (and a conductive die bonding agent) and the occurrence rate of detachment in the hot and humid stress test. FIG. 6B illustrates the relationship between the area of the conductive die pad (and the conductive die bonding agent) and the operation failure rate in the hot and humid stress test.

As illustrated in FIG. 6A and FIG. 6B, when the area of the conductive die pad (and the conductive die bonding agent) was 6.1 mm² (the comparative example), the sealing resin was detached in a part of 60% or more of the entire area of the product, and 40% or more of the semiconductor module incurred operation failures. When the area of the conductive die pad 11b (and the conductive die bonding agent 14a) was 5.0 mm² (the first embodiment), the detachment rate of the sealing resin remained below 40% of the entire area of the product, and below 10% of the semiconductor module incurred operation failures.

Even when the size of the semiconductor die 12a was changed, reductions in detachment and operation failure were verified if the area of the conductive die pad 11b (and the conductive die bonding agent 14a) was 5.0 mm². For example, when the size of the semiconductor die 12a was, e.g., 1.16 mm×1.06 mm, the foregoing effect was verified.

Further, when the sum of the areas of the conductive die pads 11c and 11c' (and the conductive die bonding agents 14a and 14b) was 4.9 mm² (the second embodiment and a modification example thereof), further reductions in detachment and operation failure were verified. It was possible to reduce the operation failure rate, in particular, to 0%.

In addition, when the area of the conductive die pad 11c was 3.2 mm² (the third embodiment), further reductions in detachment and operation failure were verified. It was possible to reduce, in particular, both the detachment occurrence rate and the operation failure to 0%.

Further, the results of similar hot and humid stress tests carried out on various configurations obtained by combining the foregoing configurations have revealed that, qualitatively, the detachment and operation failures can be reduced by decreasing the areas of the conductive die pads. For example, as illustrated by the second embodiment in comparison with the configuration of the comparative example, even if the surface area of the conductive die bonding agent is 5.0 mm² or more, the effect for reducing the detachment and the operation failures is obtained by adopting a configuration free of a conductive die bonding agent in a region between adjoining semiconductor dies, which are electrically connected by a wire, as compared with a configuration involving a conductive die bonding agent. Similarly, even if the surface area of the conductive die bonding agent is 5.0 mm² or more, the effect for reducing the detachment and the operation failures is obtained by using an insulating die bonding agent in the case of a semiconductor die that does not require the electrical connection from a bottom surface, as compared with the case involving the conductive die bonding agent, as illustrated by the third embodiment in comparison with the configuration of the comparative example. However, the operation failure rate in the hot and humid stress tests was dramatically decreased, regardless of the size of the semiconductor die, by setting the surface area of the conductive die pad (and the conductive die bonding agent) to 5.0 mm² or less.

Figure 7B:
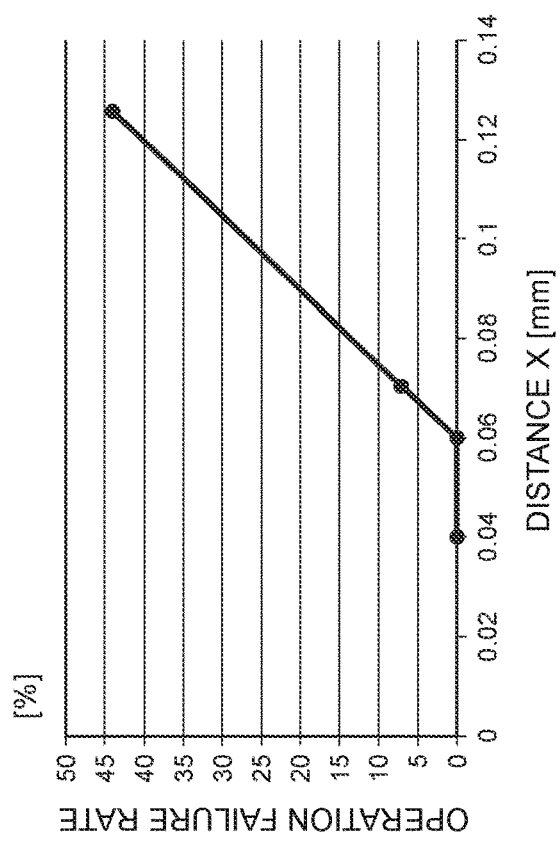
FIGS. 7A and 7B present graphs illustrating the distances between the conductive die pad and a semiconductor die in a planar view, and the results of hot and humid stress tests.
Figure 7A:
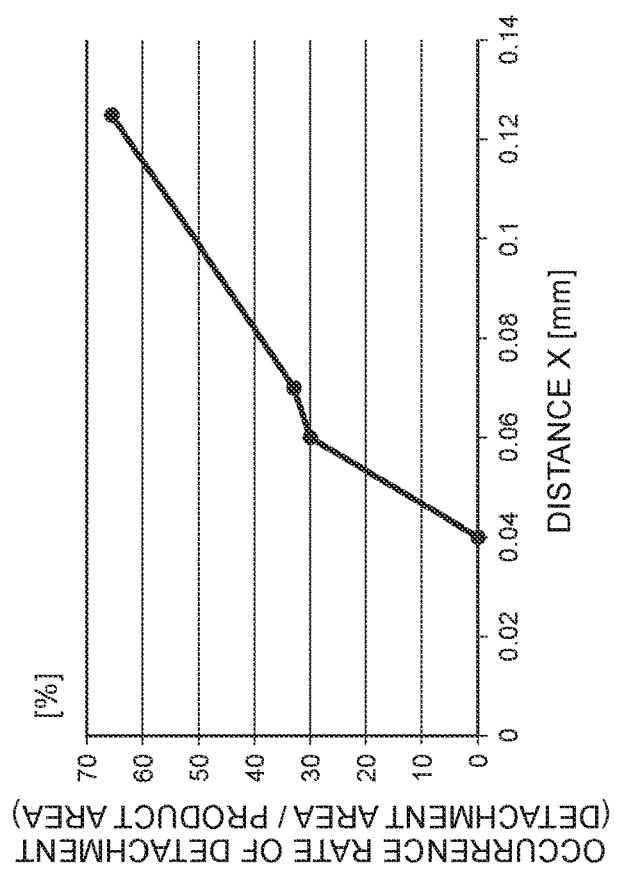

Further, FIG. 7A illustrates the relationship between the distance X and the detachment occurrence rate in the hot and humid stress tests. FIG. 7B illustrates the relationship between the distance X and the operation failure rate in the hot and humid stress tests. The experiment results can be obtained mainly by further decreasing the size of the conductive die pad 11b of the semiconductor module 2.

As illustrated in FIG. 7A and FIG. 7B, when X was 0.125 mm (the comparative example), the sealing resin was detached in a portion of 60% or more of the entire area of the product, and 40% or more of the semiconductor module incurred operation failures. When X was 0.07 mm, the detachment rate of the sealing resin was below 40% of the entire area of the product, and below 10% of the semiconductor module incurred operation failures.

Even when the size of the semiconductor die 12a was changed, reductions in detachment and operation failure were verified when X was set to 0.07 mm. Further, it was possible to reduce the operation failure rate to 0% by further decreasing X to 0.06 mm, and to reduce the detachment occurrence rate to 0% by further decreasing X to 0.04 mm.

Thus, the detachment and the operation failures can be reduced by decreasing the distance X between the boundary of the semiconductor die and the boundary of the conductive die pad (and the boundary of the conductive die bonding agent that runs off of the conductive die pad) in the planar view. This is because, when a part of the conductive die bonding agent, which part exists in a gap between the conductive die pad and the semiconductor die, is compared with a part of the conductive die bonding agent, which part exists in a gap between the portion of the conductive die pad around the semiconductor die and the sealing resin, the latter conductive die bonding agent is considered to contribute to the detachment from the sealing resin and an operation failure. The foregoing effect is displayed when the area of the conductive die pad is set to 5.00 mm² or less; however, even if the area of the conductive die pad is larger than 5.00 mm², the foregoing effect will be displayed by decreasing the distance X.

As described above, in the structure in which the conductive die bonding agent electrically connects the conductive die pad and the semiconductor die is sealed by a resin, setting the areas of the conductive die pad and the conductive die bonding agent to 5.00 mm² or less enables the operation failure rate to be reduced by approximately 30% in comparison with the cases where the areas are set to be larger than 5.00 mm². When the foregoing setting of the areas is applied to all or nearly all the conductive die pads in a semiconductor module, the advantageous effect is more obvious. Alternatively, however, the setting of the areas may be applied to only several conductive die pads and the conductive die bonding agents (e.g. at least half the conductive die pads with the conductive die bonding agents included in the semiconductor module). Further, a part of the conductive die bonding agent may run off of a conductive die pad.

Figure 8:
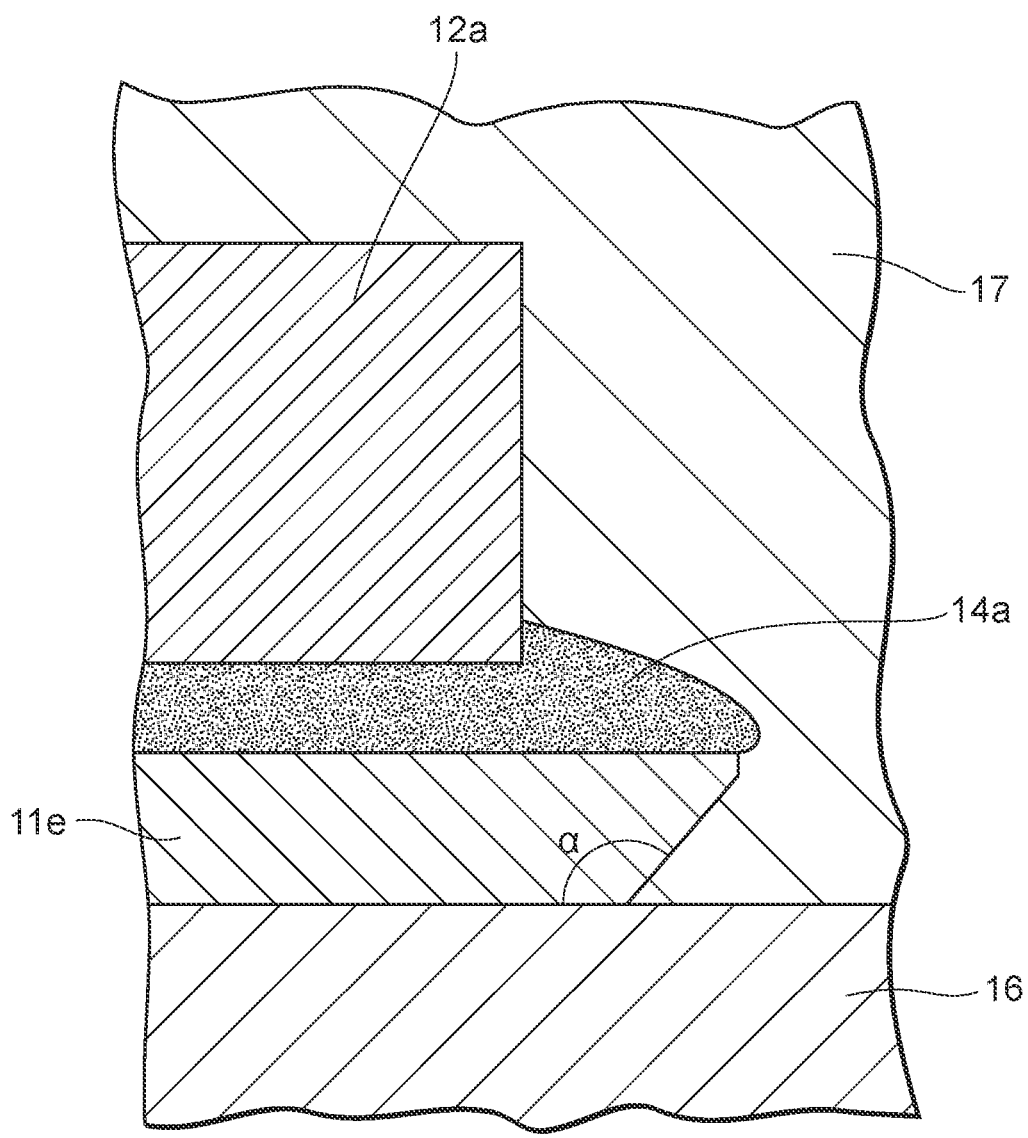
FIG. 8 illustrates the edge of a conductive die pad having an inverse tapered shape.

Decreasing the area of a conductive die pad leads to a higher possibility of the conductive die bonding agent running off of the conductive die pad and coming in contact with a wire bonding pad 18, resulting in an operation failure. Hence, as illustrated in FIG. 8, the edge of a conductive die pad 11e may be formed to have an inverse tapered shape (shaped to expand in the opposite direction from the surface of a PCB base 16), and on a section perpendicular to the surface of the PCB base 16, an angle of contact α with the PCB base 16 may be set to an obtuse angle so as to increase the surface tension relative to the conductive die bonding agent 14a thereby to restrain the conductive die bonding agent 14a from running off.

The following will describe the manufacturing method for the conductive die pad 11e. First, a mask (not illustrated) is attached to the surface of the PCB base 16 not provided with the conductive die pad 11e. The mask has an acute contact angle with respect to the surface of the PCB base 16. With the mask attached, the conductive die pad 11e is formed by plating or the like. Since the mask has the acute contact angle with respect to the surface of the PCB base 16, the conductive die pad 11e can be formed to have the inverse tapered shape with the obtuse contact angle α.

Thus, forming the edge of the conductive die pad 11e into the inverse tapered shape makes it possible to increase the angle of contact with the conductive die bonding agent and therefore to restrain the conductive die bonding agent from running off. This enables the conductive die pad 11e to have a reduced area. As a result, the area of the conductive die pad 11e exposed to the sealing resin 17 makes it possible to decrease the area of the conductive die bonding agent opposing thereto, thus enabling the occurrence of detachment, which is attributable to the conductive die bonding agent, to be restrained. Alternatively, only a part of the edge of the conductive die pad 11e rather than the entire edge may be formed to the inverse tapered shape.

Further, the material of the conductive die bonding agent may be changed to a material which has a higher thermal conductivity than that of a conventional material. In the case of the comparative example, the entire bottom surface of the semiconductor die 12a has the wet spread of the conductive die bonding agent 14a in order to satisfy required heat dissipation characteristics. On the other hand, using a conductive die bonding agent having a higher thermal conductivity, e.g., a conductive die bonding agent 14d of 2.5 [W/m·K] or more, makes it possible to satisfy a specification even if the area of the conductive die bonding agent is reduced.

Figure 9:
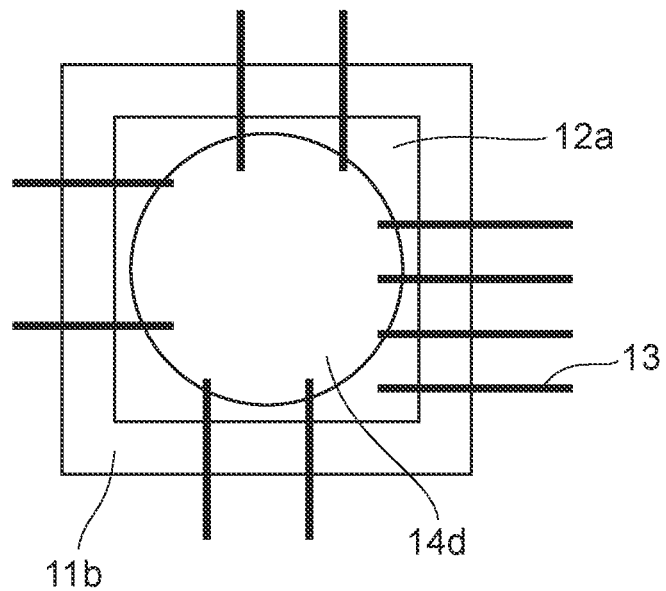
FIG. 9 is a plan view illustrating a conductive die bonding agent with reduced wet spread.

For example, almost the entire or the entire conductive die bonding agent 14d may be formed to remain within the region occupied by the semiconductor die 12a provided on the conductive die pad 11b in the planar view, as illustrated in FIG. 9. In other words, it can be said that, in the planar view, a region of the outer edge (a fourth region) exposed to the sealing resin in the region occupied by the conductive die pad 11b surrounds a region (a third region) covered by the conductive die bonding agent 14d.

Figure 10:
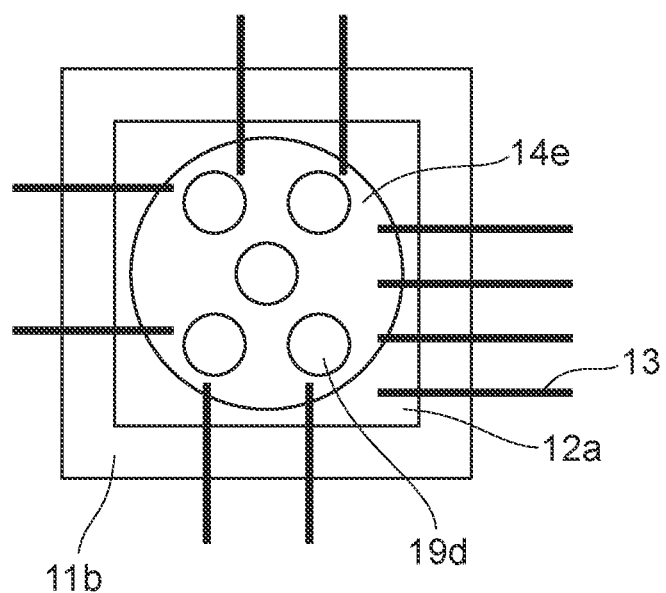
FIG. 10 is a plan view illustrating a conductive die pad on a plurality of heat dissipation vias.

Further, as illustrated in FIG. 10, a configuration may be adopted, in which a plurality of heat dissipation vias 19d are formed in a region occupied by a conductive die bonding agent 14e in the planar view in order to improve the heat dissipation. The vias 19d formed in the substrate are filled with a metal, thus providing high heat dissipation effect. Therefore, the wet spread area of the conductive die bonding agent 14e can be reduced, and the heat dissipation characteristics can be maintained while restraining the conductive die bonding agent 14e from running off of the conductive die pad 11b, by providing the conductive die pad 11b and the conductive die bonding agent 14e such that the plurality of vias 19d are included in the region occupied by the conductive die bonding agent 14e.

Further, a configuration that combines the conductive die bonding agent 14d having a higher thermal conductivity and the foregoing configuration may be adopted to further reduce the wet spread area of the conductive die bonding agent 14d. In addition, the area of the wet spread can be reduced also by introducing a conductive die bonding agent 14e with a higher viscosity. For example, even in a case where a conductive die bonding agent with a regular viscosity (a sixth conductive die bonding agent) is used and runs off of the conductive die pad 11b and comes in contact with the PCB base 16, it is possible to maintain a larger contact angle to restrain the wet spread by using the conductive die bonding agent 14e having a higher viscosity (e.g. 8000 [cP] or more).

Further, in place of a conductive die bonding agent, a conductive die attach film (DAF) may be used to connect a semiconductor die and a conductive die pad in a region where the possibility of the occurrence of at least the detachment is likely to be high. With this arrangement, the wet spread problem can be eliminated.

Figure 11:
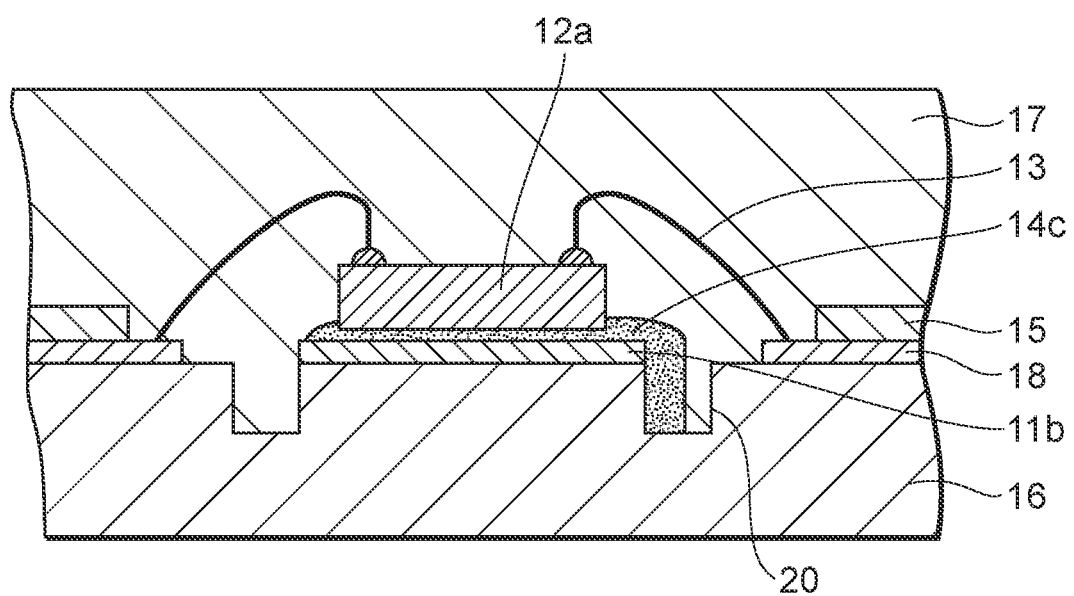
FIG. 11 is a sectional view of a PCB base in which an anti-flow groove has been formed.

Further, as illustrated in FIG. 11, a configuration may be adopted, in which a groove 20 is formed in the PCB base 16 to stop the wet spread of the conductive die bonding agent 14c that runs off of the conductive die pad 11b. For example, even if the conductive die bonding agent 14c runs off, the conductive die bonding agent will flow into the groove 20 formed in the surface of the PCB base 16 between the semiconductor die 12a and the wire bonding pad 18 connected with the semiconductor die 12a by the wire 13, thus enabling an operation failure to be restrained.

Each of the configurations may be used alone or may be combined. Further, the configurations can be applied regardless of the area of a conductive die pad (and a conductive die bonding agent).

The following will describe a fourth embodiment.

For the fourth embodiment and after, the aspects common to the first embodiment will not be described, and only different aspects will be described. In particular, the same operation and effect obtained by the same configuration will not be described for each embodiment.

A semiconductor module according to the present embodiment has a configuration in which a semiconductor die and a plurality of conductive die pads formed apart are bonded by a conductive die bonding agent. The conductive die bonding agent electrically connects at least one conductive die pad and a semiconductor die, and electrically connects another conductive die pad, which is formed apart from the foregoing conductive die pad, and the semiconductor die, and covers a region between the semiconductor die and a substrate, the region being located between the conductive die pads.

Figure 12A:
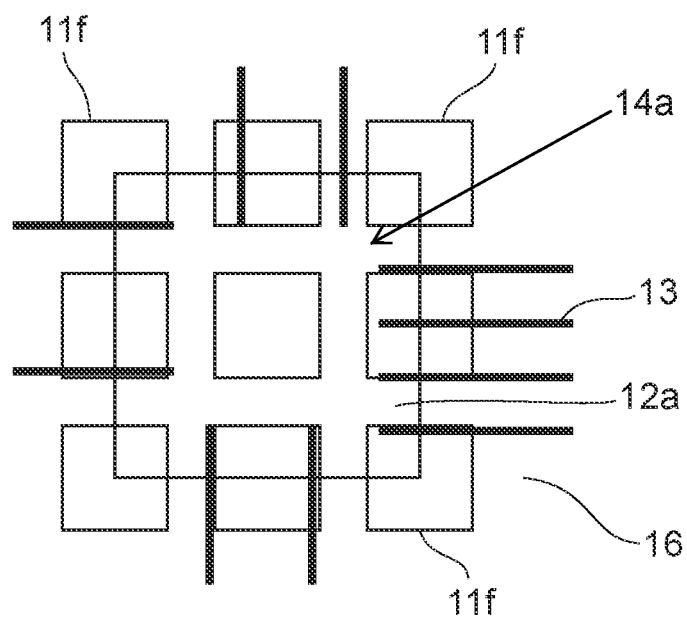
FIGS. 12A and 12B present plan views illustrating a semiconductor die provided on conductive die pads formed apart from each other.

For example, FIG. 12A illustrates a configuration which has nine conductive die pads 11f formed apart from each other and a semiconductor die 12a electrically connected with at least a part of each of the conductive die pad 11f through a conductive die bonding agent 14a (not illustrated). In the planar view, therefore, the semiconductor die 12a has regions that overlap at least a part of each of the conductive die pads 11f.

Thus, the conductive die pads 11f are provided, being divided into smaller segments arranged in a mesh-like pattern. With this arrangement, the conductive die bonding agent 14a provides the electrical connection between each of the conductive die pads 11f and the semiconductor die 12a. In addition, the conductive die bonding agent 14a is positioned in the gaps between the conductive die pads 11f and the semiconductor die 12a so as to provide contact with the surface of a PCB base 16 having a height and a material that are different from those of the conductive die pads 11f, thus making it possible to restrain the detachment by the enhanced adhesive strength due to an anchoring effect based on the difference in height.

Figure 12B:
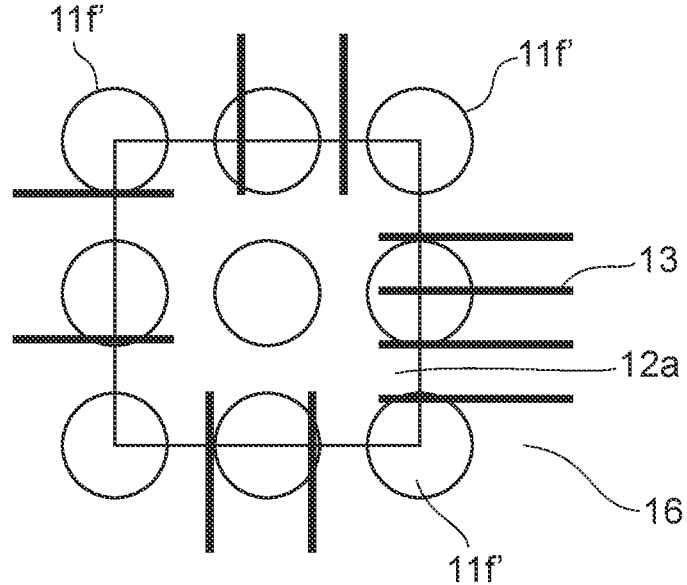

As illustrated in FIG. 12B, the conductive die pads 11f arranged in the mesh-like pattern may be provided, in a via land shape, as annular conductive die pads connected to the vias 19d, which are passed through a part of or the entire PCB base 16. In this case, the heat dissipation effect of the via land can be expected in addition to the anchoring effect, so that the occurrence of the detachment can be prevented due to the restraint of the wet spread of the conductive die bonding agent 14a.

The following will describe a fifth embodiment.

Figure 13:
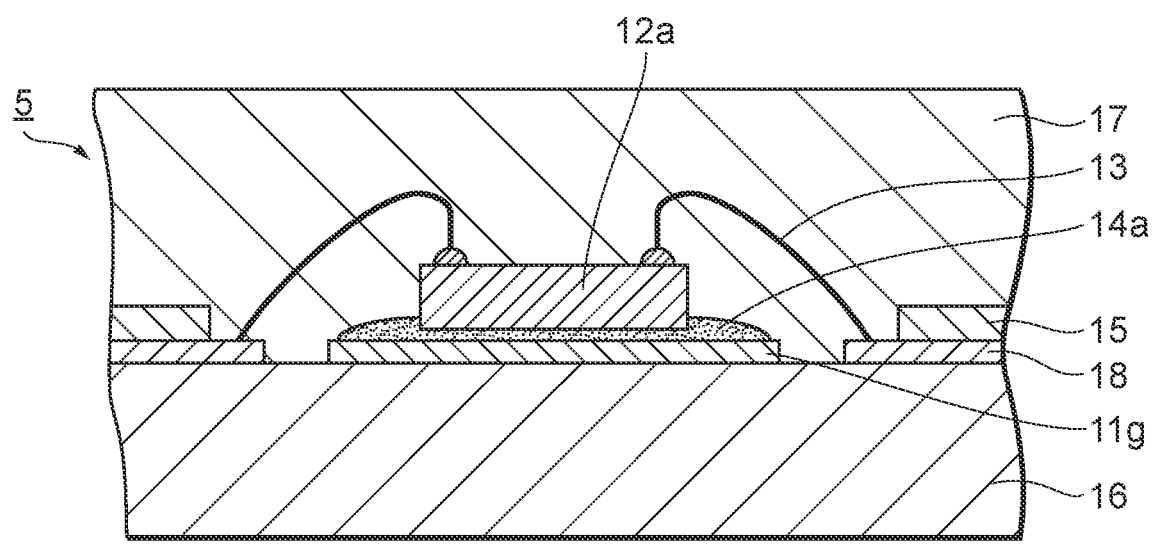
FIG. 13 is a sectional view of a semiconductor module according to a fifth embodiment.

As illustrated in FIG. 13, a semiconductor module 5 includes a PCB base 16 (substrate), on which a conductive die pad 11g and a semiconductor die 12a provided on the conductive die pad 11g are placed, the conductive die pad 11g and the semiconductor die 12a being electrically connected by a conductive die bonding agent 14a. Further, adjacently to the conductive die pad 11g, a wire bonding pad 18 and a metal wire provided continuously from the wire bonding pad 18 are formed. The semiconductor die 12a and the wire bonding pad 18 are electrically connected by a wire 13. Further, the semiconductor die 12a, the conductive die pad 11g, the conductive die bonding agent 14a, the wire 13, the wire bonding pad 18 and the like are sealed by a sealing resin 17.

In the present embodiment, the surface of the wire bonding pad 18 is made of Cu plated with Au or an alloy containing Au, such as NiPdAu. Hence, the wire bonding pad 18 can be ideally attached to the wire 13 made of, in particular, gold or the like.

The conductive die pad 11g, on which the semiconductor die 12a having the other end of the wire 13 is provided, is not plated with an alloy containing Au. The conductive die pad 11g, including its surface, is made of Cu. Further, the Cu, which is the material of the conductive die pad 11g, and the semiconductor die 12a are electrically connected by the conductive die bonding agent 14a.

Figure 14A:
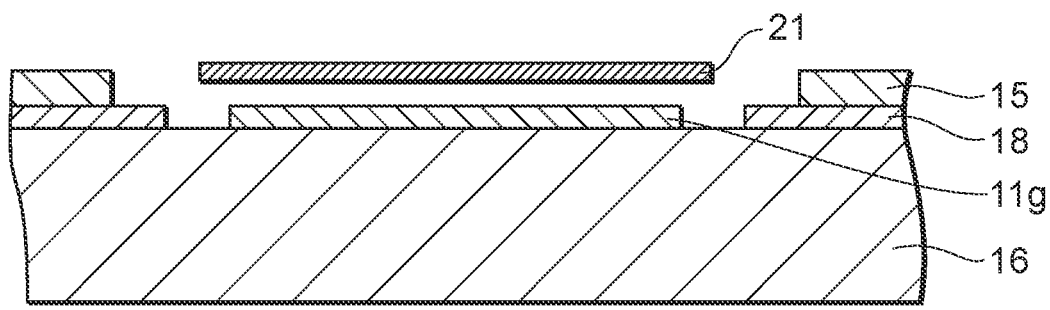
FIGS. 14A and 14B present diagrams illustrating the manufacturing process of the semiconductor module according to the fifth embodiment.
Figure 14B:
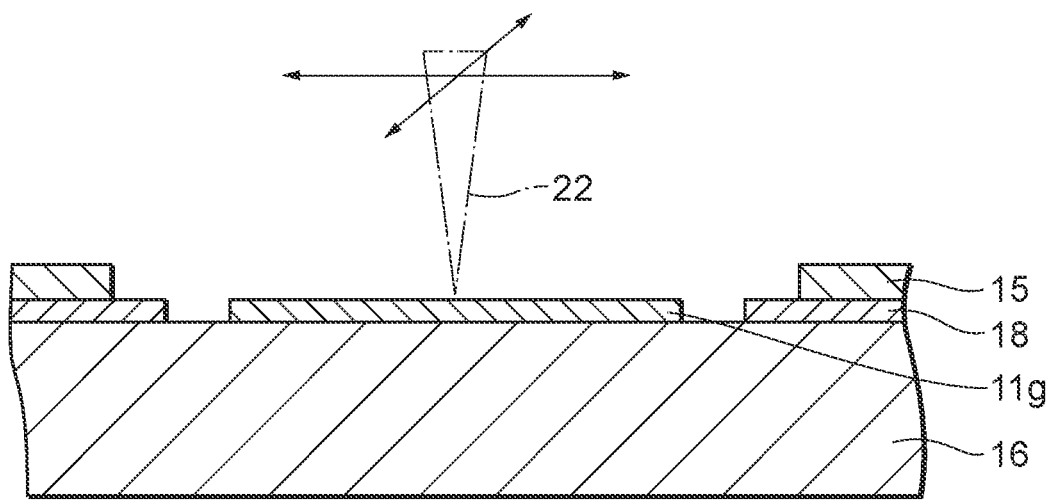

The structure described above can be obtained according to the method illustrated in FIGS. 14A-14B.

First, Cu is used to form the wire bonding pad 18, the wires connected thereto and the conductive die pad 11g on the PCB base 16. Then, a solder resist is applied to the wires excluding the wire bonding pad 18 to protect the wires. Subsequently, a mask film 21 is attached to the conductive die pad 11g, the Cu of which is to be exposed, and then the conductive die pad 11g with the mask film 21 on is placed in an Au plating tank to carry out Au plating (FIG. 14A).

As a result, the conductive die pad 11g with the mask film 21 attached thereto, including the surface thereof, is formed of Cu, and the surface of the wire bonding pad 18 is plated with NiPdAu. Thereafter, the semiconductor die 12a is bonded onto the conductive die pad 11g by the conductive die bonding agent 14a, and the entire workpiece is sealed by the sealing resin 17.

The semiconductor module 5 described above can be accomplished by the aforesaid manufacturing process. Alternatively, Au may be plated on the surface of the conductive die pad 11g without attaching the mask film 21, and then the plating may be removed using a laser 22 to expose the Cu surface, as illustrated in FIG. 14B.

Figure 15:
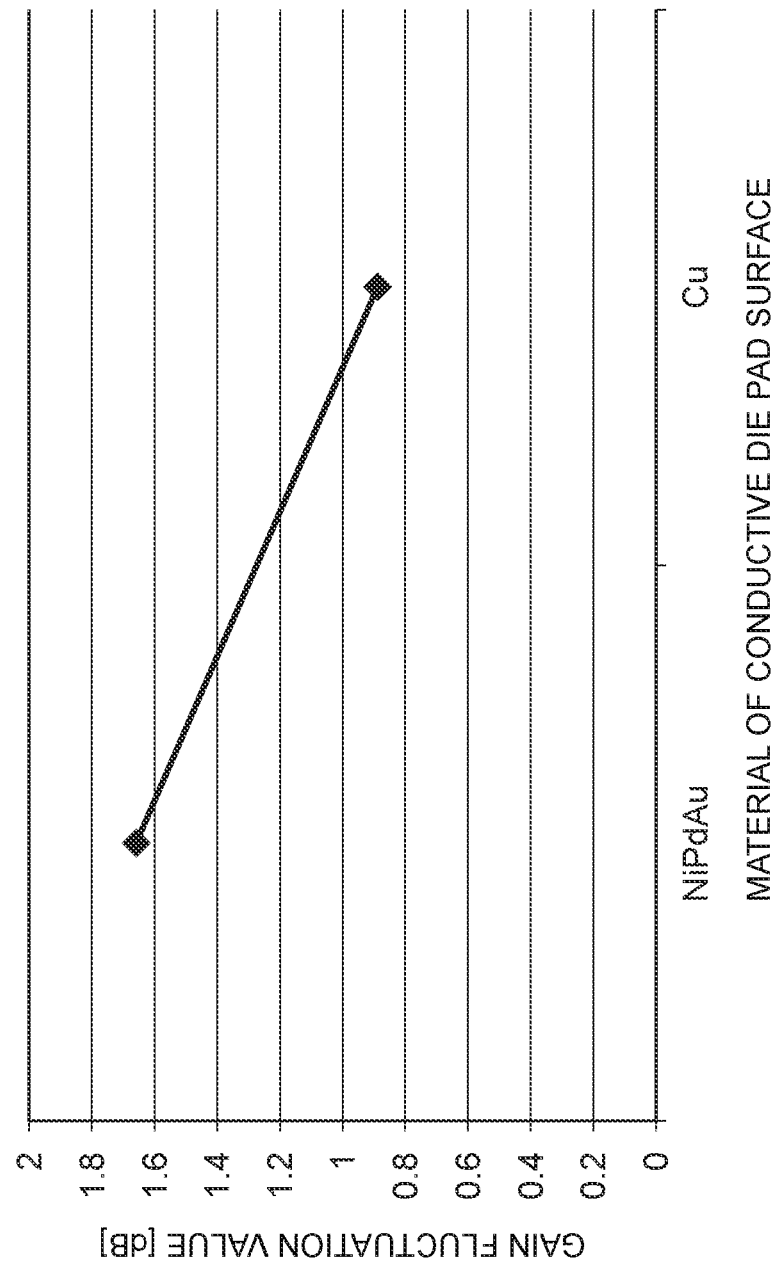
FIG. 15 is a graph illustrating the comparison in gain fluctuation value after a hot and humid stress test between a conductive die pad using NiPdAu as the surface material thereof and a conductive die pad using Cu as the surface material thereof.

FIG. 15 is a graph illustrating the comparison of the gain fluctuation values after the hot and humid stress test between the case where NiPdAu is used as the material of the surface of the conductive die pad and the case where Cu is used as the material. As illustrated in the graph, a gain fluctuation value below 1 dB has been achieved in the latter case in contrast to the former case where the gain fluctuation value was 1.6 dB or more.

The above has described the illustrative embodiments of the present disclosure.

The semiconductor module 2 described above with regard to FIG. 3, for example, includes the PCB base 16, the conductive die pad 11b placed on the substrate, the semiconductor die 12a provided on the conductive die pad 11b, the conductive die bonding agent 14a that electrically connects the conductive die pad 11b and the semiconductor die 12a, the wire bonding pad 18 provided on the PCB base 16, the wire 13 that electrically connects the wire bonding pad 18 and the semiconductor die 12a, and the sealing resin 17 that seals at least the conductive die pad 11b, the semiconductor die 12a, the conductive die bonding agent 14a, the wire bonding pad 18, and the wire 13. In the planar view, the area of the conductive die pad 11b is 5.0 mm² or less.

This arrangement makes it possible to provide a semiconductor module that restrains the detachment between a conductive die bonding agent and a conductive die pad or a semiconductor die and to restrain an operation failure. Further, in the planar view, the minimum value of the distance X between the boundary of the conductive die pad 11b and the semiconductor die 12a may be 0.07 mm or less. With this arrangement, the amount of the conductive die bonding agent 14a that runs off of the semiconductor die 12a and is exposed to the sealing resin 17 can be reduced, thus enabling the detachment to be restrained.

Further, as shown in FIG. 4A, the conductive die pad 11c provided adjacently to and apart from the conductive die pad 11c', the semiconductor die 12b provided on the conductive die pad 11c, the conductive die bonding agent 14c that electrically connects the conductive die pad 11c and the semiconductor die 12b, and the wire 13 that electrically connects the semiconductor die 12a and the semiconductor die 12b may be provided on the PCB base 16. With this arrangement, the conductive die pads are divided between adjoining semiconductor dies, thus making it possible to restrain the wet spread of the conductive die bonding agent.

Further, as shown in FIG. 4B, the semiconductor die 12b provided adjacently to the semiconductor die 12a, the conductive die bonding agent 14b that electrically connects the conductive die pad 11b and the semiconductor die 12b may be provided on the conductive die pad 11b, and the solder resist 15 provided in the gap between the semiconductor die 12a and the semiconductor die 12b may be provided on the conductive die pad 11b. With this arrangement, the solder resist 15 provided between the semiconductor dies restrains the wet spread of the conductive die bonding agent 14a into the region.

Further, as shown in FIG. 5, the second solder resist 15' provided adjacently to the semiconductor die 12a, a fourth semiconductor die 12b provided on the second solder resist 15', and the insulating or conductive die bonding agent 14b that connects the fourth semiconductor die 12b and the second solder resist 15' may be provided on the conductive die pad 11d. With this arrangement, for a semiconductor die that does not require electrical connection from the bottom surface, the insulating die bonding agent is provided, thus making it possible to restrain the occurrence of the detachment or the like attributable to a conductive die bonding agent.

On at least one section perpendicular to the surface of the PCB base 16, the conductive die pad 11e may be formed to have an inverse tapered shape having the obtuse contact angle α with respect to the PCB base 16 so as to expand in the opposite direction from the surface of a PCB base 16, as shown in FIG. 8. This arrangement makes it possible to restrain the conductive die bonding agent from running off.

The conductive die pad 11b has the third region covered by the conductive die bonding agent 14d, and the fourth region exposed to the sealing resin 17, as shown in FIGS. 9 and 11. In the planar view, the third region may be surrounded by the fourth region. With this arrangement, the surface area of the conductive die bonding agent can be reduced, thus making it possible to restrain the occurrence of the detachment attributable to the conductive die bonding agent.

Further, as shown in FIG. 10, a plurality of vias 19d may be provided in the third region in the planar view. The plurality of vias 19d are passed through the PCB base 16 and have therein a metal electrically connected with the conductive die pad 11b. This arrangement enables heat to be dissipated from the plurality of vias 19d, so that required heat dissipation characteristics can be maintained even when the amount of the conductive die bonding agent is decreased.

As the conductive die bonding agent, the conductive die bonding agent 14e may be used. The conductive die bonding agent 14e has a viscosity that is higher than the viscosity of the conductive die bonding agent 14a that runs off of the conductive die pad 11b and comes in contact with the PCB base 16 when the same amount as that of the conductive die bonding agent 14e is used, and also has a higher angle of contact than the angle of contact between the conductive die bonding agent 14a and the PCB base 16. With this arrangement, the wet spread of the conductive die bonding agent 14e can be restrained.

Further, as shown in FIG. 11, the groove 20 is formed in the region between the conductive die pad 11b and the wire bonding pad 18 on the PCB base 16, and a part of the conductive die bonding agent 14c may flow into the groove 20. This arrangement enables the wet spread of the conductive die bonding agent 14e to be restrained, so that the detachment due to the wet spread can be restrained.

Further, as shown in FIG. 13, the semiconductor module 5 includes the PCB base 16, the conductive die pad 11g which is provided on the PCB base 16 and the surface material of which is Cu, the semiconductor die 12a provided on the conductive die pad 11g, the conductive die bonding agent 14a that electrically connects the conductive die pad 11g and the semiconductor die 12a, the wire bonding pad 18 which is provided on the PCB base 16 and the surface material of which is a metal containing Au, and the wire 13 that electrically connects the wire bonding pad 18 and the semiconductor die 12a. This arrangement makes it possible to provide a semiconductor module that exhibits improved gain characteristics, as compared with the case where a conductive die pad using Au as its surface material is adopted.

A metal wire to be connected to the wire bonding pad 18 may be further provided, and the conductive die pad 11g and the metal wire may be formed using the same metal material containing Cu. With this arrangement, the conductive die pad and the metal wire can be formed in the same process.

Further, as shown in FIG. 12A, the semiconductor module may include the PCB base 16, the first conductive die pad 11f provided on the PCB base 16, the second conductive die pad 11f provided adjacently to and apart from the first conductive die pad 11f on the PCB base 16, the semiconductor die 12a, and the conductive die bonding agent 14a which is in contact with the first conductive die pad 11f, the second conductive die pad 11f, and the PCB base 16 in the gap between the first conductive die pad 11f and the second conductive die pad 11f and which electrically connects the first conductive die pad 11f and the second conductive die pad 11f to the semiconductor die 12a. According to this configuration, the conductive die bonding agent is in contact with both the conductive die pads and the substrate, thus making it possible to further restrain the detachment by the anchoring effect.

Further, as shown in FIG. 12B, the vias 19d may be provided, which are passed through the PCB base 16 and which have therein metals to be electrically connected with the conductive die pads 11f, and the vias 19d may be provided, which are passed through the PCB base 16 and which have therein metals to be electrically connected with the conductive die pads 11*f*. With this arrangement, heat can be dissipated through the vias, so that the conductive die bonding agent that is responsible for the detachment can be decreased.

Further, a first conductive die pad may be formed to be annular and connected to a first via 19*d*, and a second conductive die pad may be formed to be annular and connected to a second via 19*d*. With this arrangement, conductive die pads can be provided by making use of a via land.

The embodiments described above are intended for easy understanding of the present disclosure, and are not to be considered as limiting the present disclosure. The present disclosure can be modified or improved without departing from the spirit thereof, and the present disclosure covers equivalents thereof. More specifically, anything obtained by adding design alterations, as necessary, to the embodiments by persons skilled in the art will be encompassed by the scope of the present disclosure insofar as the features of the present disclosure are included. For example, the elements used in the embodiments and the placement, the materials, the conditions, the shapes, the sizes, and the like of the elements are not limited to those illustrated and may be changed, as appropriate. Further, it is needless to say that the embodiments are illustrative, and configurations illustrated in different embodiments can be partly replaced or combined, and these are to be covered by the scope of the present disclosure insofar as the features of the present disclosure are included.

What is claimed is:

1. A semiconductor module comprising:
   a substrate;
   a first conductive die pad provided on the substrate;
   a second conductive die pad provided adjacently to and apart from the first conductive die pad on the substrate;
   a wire bonding pad provided on the substrate;
   a semiconductor die;
   a conductive die bonding agent which is in contact with the first conductive die pad, the second conductive die pad, and the substrate in a gap between the first conductive die pad and the second conductive die pad and which electrically connects the first conductive die pad and the second conductive die pad to the semiconductor die;
   a wire that electrically connects the wire bonding pad and the semiconductor die; and
   a sealing resin that seals the first conductive die pad, the second conductive die pad, the wire bonding pad, the semiconductor die, the conductive die bonding agent, and the wire.

2. A semiconductor module comprising:
   a substrate;
   a first conductive die pad provided on the substrate;
   a second conductive die pad provided adjacently to and apart from the first conductive die pad on the substrate;
   a semiconductor die;
   a conductive die bonding agent which is in contact with the first conductive die pad, the second conductive die pad, and the substrate in a gap between the first conductive die pad and the second conductive die pad and which electrically connects the first conductive die pad and the second conductive die pad to the semiconductor die;
   a first via which passes through the substrate and which has therein a metal to electrically connect with the first conductive die pad; and
   a second via which passes through the substrate and which has therein a metal to electrically connect with the second conductive die pad.

3. The semiconductor module according to claim 2, wherein:
   the first conductive die pad is formed annular and connected to the first via; and
   the second conductive die pad is formed annular and connected to the second via.

\* \* \* \* \*